United States Patent
Deshpande et al.

(10) Patent No.: US 7,460,346 B2
(45) Date of Patent: Dec. 2, 2008

(54) ARC FAULT DETECTION AND CONFIRMATION USING VOLTAGE AND CURRENT ANALYSIS

(75) Inventors: Vijay V. Deshpande, Bangalore (IN); Prashant K. Prabhu, Ranebennur (IN)

(73) Assignee: Honeywell International Inc., Morristown, NJ (US)

( * ) Notice: Subject to any disclaimer, the term of this patent is extended or adjusted under 35 U.S.C. 154(b) by 575 days.

(21) Appl. No.: 11/227,578

(22) Filed: Sep. 15, 2005

(65) Prior Publication Data
US 2006/0215335 A1    Sep. 28, 2006

(30) Foreign Application Priority Data
Mar. 24, 2005    (IN)   ................. 948/DEL/2005

(51) Int. Cl.
*H02H 7/00*    (2006.01)
(52) U.S. Cl. ........................................ 361/62
(58) Field of Classification Search ............... 361/62
See application file for complete search history.

(56) References Cited

U.S. PATENT DOCUMENTS

| | | | |
|---|---|---|---|
| 4,450,497 A * | 5/1984 | Bignell | 361/82 |
| 4,775,839 A | 10/1988 | Kosina et al. | |
| 5,459,630 A | 10/1995 | MacKenzie et al. | |
| 5,519,561 A | 5/1996 | Mrenna et al. | |
| 5,578,931 A | 11/1996 | Russell et al. | |
| 5,659,453 A | 8/1997 | Russell et al. | |
| 5,691,869 A | 11/1997 | Engel et al. | |
| 5,729,145 A | 3/1998 | Blades | |
| 5,805,397 A | 9/1998 | MacKenzie | |
| 5,805,398 A | 9/1998 | Rae | |
| 5,815,352 A | 9/1998 | Mackenzie | |
| 5,889,643 A | 3/1999 | Elms | |
| 5,896,262 A | 4/1999 | Rae et al. | |
| 5,933,305 A | 8/1999 | Schmalz et al. | |
| 5,940,256 A | 8/1999 | MacKenzie et al. | |
| 5,963,405 A | 10/1999 | Engel et al. | |
| 5,963,406 A | 10/1999 | Neiger et al. | |

(Continued)

FOREIGN PATENT DOCUMENTS

EP    939472    9/1999

(Continued)

OTHER PUBLICATIONS

Lacourse J R et al.: "Voltage-current characteristics of an AC arc for different electrode separations with application to electrosurgery II", Bioengineering Conference, Newark, New Jersey, 1993, Mar. 18, 1993, pp. 37-39.

(Continued)

*Primary Examiner*—Stephen W Jackson
(74) *Attorney, Agent, or Firm*—Oral Caglar, Esq.

(57) ABSTRACT

An arc fault in an electrical circuit is detected by recording phase plane plot data of current versus voltage for at least one electrical cycle of an alternating current signal, and applying a phase plane plot arc fault monitoring algorithm to the phase plane plot data to determine whether an arc fault is present. An arc fault detection algorithm and an arc fault confirmation algorithm are employed to detect and confirm the presence of series and parallel arc faults in a circuit.

33 Claims, 3 Drawing Sheets

U.S. PATENT DOCUMENTS

| | | |
|---|---|---|
| 5,969,920 A | 10/1999 | Mackenzie |
| 5,982,593 A | 11/1999 | Kimblin et al. |
| 5,986,860 A | 11/1999 | Scott |
| 6,002,561 A | 12/1999 | Dougherty |
| 6,031,699 A | 2/2000 | Dollar, II et al. |
| 6,229,679 B1 | 5/2001 | Macbeth |
| 6,259,996 B1 | 7/2001 | Haun et al. |
| 6,266,219 B1 | 7/2001 | Macbeth et al. |
| 6,300,766 B1 | 10/2001 | Schmalz |
| 6,362,628 B2 | 3/2002 | Macbeth et al. |
| 6,370,001 B1 | 4/2002 | Macbeth |
| 6,373,257 B1 | 4/2002 | Macbeth et al. |
| 6,456,471 B1 | 9/2002 | Haun et al. |
| 6,459,273 B1 | 10/2002 | Dollar, II et al. |
| 6,477,021 B1 | 11/2002 | Haun et al. |
| 6,504,692 B1 | 1/2003 | Macbeth et al. |
| 6,525,918 B1 | 2/2003 | Alles et al. |
| 6,532,140 B1 | 3/2003 | McMahon et al. |
| 6,552,884 B2 | 4/2003 | Kim et al. |
| 6,556,397 B2 | 4/2003 | Kim et al. |
| 6,577,484 B1 | 6/2003 | Macbeth et al. |
| 6,590,757 B2 | 7/2003 | Pahl et al. |
| 2001/0029433 A1 | 10/2001 | Scott |
| 2002/0063565 A1 | 5/2002 | Stroth |
| 2002/0085327 A1 | 7/2002 | Kim et al. |
| 2002/0149899 A1 | 10/2002 | Kladar et al. |
| 2003/0099070 A1 | 5/2003 | Macbeth et al. |
| 2003/0117754 A1 | 6/2003 | Zuercher et al. |
| 2003/0156367 A1 | 8/2003 | Macbeth |
| 2003/0201780 A1 | 10/2003 | Blades |
| 2003/0202303 A1 | 10/2003 | Parker |
| 2006/0215335 A1 | 9/2006 | Deshpande et al. |

FOREIGN PATENT DOCUMENTS

| | | |
|---|---|---|
| EP | 963023 | 12/1999 |
| GB | 2348751 | 10/2000 |
| GB | 2375244 | 11/2002 |
| JP | 62 236323 A | 10/1987 |
| JP | 05 256894 A | 10/1993 |
| JP | 11 142466 A | 5/1999 |
| JP | 2001-281290 | 10/2001 |
| WO | WO-8300562 | 2/1983 |
| WO | 0 619 694 A1 | 10/1994 |
| WO | WO 99/60417 A | 11/1999 |

OTHER PUBLICATIONS

International Search Report dated Mar. 15, 2007.

* cited by examiner

ARC FAULT DETECTION AND CONFIRMATION USING VOLTAGE AND CURRENT ANALYSIS

CROSS REFERENCE TO RELATED APPLICATIONS

This application claims priority to India Patent Application No. 648/DEL/2005, filed Mar. 24, 2005, which is incorporated herein by reference.

FIELD OF THE INVENTION

The invention relates generally to electrical fault detection, and more specifically to detecting arc faults using voltage and current monitoring.

BACKGROUND

Electrical circuits such as house wiring, industrial controls, and aircraft electrical systems often use relatively high voltages and are capable of supplying high currents, such that electrical faults can be particularly dangerous. An arc fault is one such type of electrical fault, resulting from current discharge from one conductor to another in an electrical circuit.

The arc fault is typically the result of some unintended change in physical configuration between conductors that allows current to either flow through a conducting medium or jump across a nonconductive medium from one conductor to another. One common example is worn or aged insulation around electrical wiring in a home, which allows the house's wiring to contact other house wiring. Similarly, loose connections in an outlet, junction box, or light can allow a circuit wire to become free and move, coming in contact with another conductor and creating an arc fault.

Wiring can also be damaged by sharp objects during insulation,, such as by nicking a wire's insulation during installation or wear as a wire rubs against a sharp edge of a junction box. Various connectors and contacts can also wear and deform, and salt bridges can form between conductors in salty or corrosive environments such as near saltwater. Electrical codes and wiring standards seek to minimize the chances of such arc faults occurring, but they remain a significant source of damage to electrical systems and their environments.

These arc faults are the root cause of a number of industrial, residential, and aircraft accidents, particularly in electrical distribution systems. It is therefore important to be able to detect arc faults in electrical systems such as power distribution systems, so that the damage done can be regulated.

Overcurrent regulators such as traditional circuit breakers and fuses can't handle all arc faults, because the fault currents are often within the normal current range of the circuit breaker or fuse. Sparks jumping from one conductor to another, for example, can have relatively little current despite near-constant sparking or arcing. Similarly, as insulation between two conductors becomes worn, the contact area between conductors is very small at first and low-current arcs jump between conductors. Similarly, normal arcs are common in a variety of setting including home and residential, as a result of motors starting, capacitors charging, and other such spikes in current draw in a circuit.

This illustrates the need for a method for accurately detecting arc faults in an electrical circuit, even at relatively low current levels.

SUMMARY

The present invention provides in one example embodiment a method of detecting an arc fault in an electrical circuit by recording phase plane plot data of current versus voltage for at least one electrical cycle of an alternating current signal, and applying a phase plane plot arc fault monitoring algorithm to the phase plane plot data to determine whether an arc fault is present. In a further embodiment, an arc fault detection algorithm and an arc fault confirmation algorithm are employed to detect and confirm the presence of series and parallel arc faults in a circuit.

DETAILED DESCRIPTION

In the following detailed description of sample embodiments of the invention, reference is made to the accompanying drawings which form a part hereof, and in which is shown by way of illustration specific sample embodiments in which the invention may be practiced. These embodiments are described in sufficient detail to enable those skilled in the art to practice the invention, and it is to be understood that other embodiments may be utilized and that logical, mechanical, electrical, and other changes may be made without departing from the spirit or scope of the present invention. The following detailed description is, therefore, not to be taken in a limiting sense, and the scope of the invention is defined only by the appended claims.

One example embodiment of a method of detecting an arc fault in an electrical circuit records phase plane plot data of current versus voltage for at least one electrical cycle of an alternating current signal, and applies a phase plane plot arc fault monitoring algorithm to the phase plane plot data to determine whether an arc fault is present. This and other example embodiments are described in greater detail herein.

Figure 1:
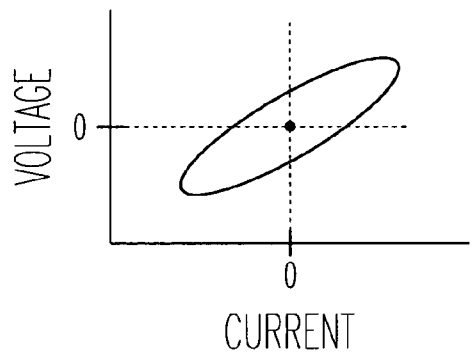
FIG. 1 shows a phase plane current v. voltage plot of one cycle of a power signal attached to a normal load, consistent with an example embodiment of the present invention.
Figure 2:
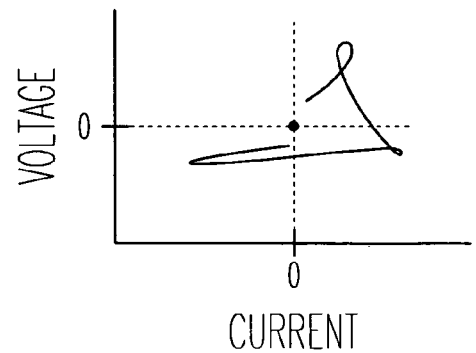
FIGS. 2 through 4 show a phase plane current v. voltage plots of one cycle of a power signal attached to loads via conductors having arc faults, consistent with example embodiments of the present invention.
Figure 3:
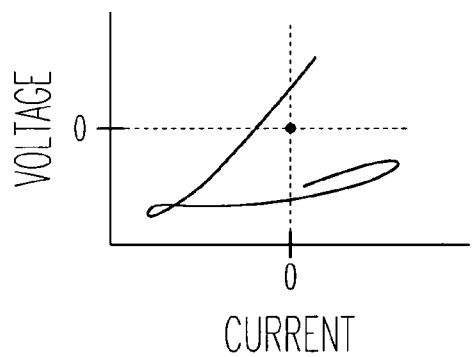
Figure 4:
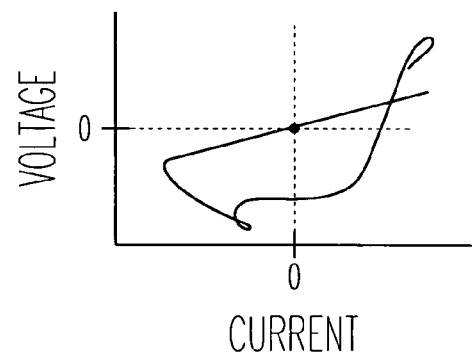

FIGS. 1-4 shows a variety of current versus voltage plots tracking current versus voltage over a fall cycle of an alternating current (AC) power signal in the presence of supply to ground arc faults. Example applications include the standard 60 Hz alternating current power signal provided to most homes and businesses, as well as 400 Hz power distributed in aircraft, and other such applications. The plot of FIG. 1 illustrates a typical current versus voltage plot, and a variety of atypical current versus voltage plots suggesting presence of an arc fault are shown in FIGS. 2, 3, and 4. The curve traced at FIG. 1 is a flattened oval shape, but is a smooth, continuous curve. In contrast, the curves shown at FIGS. 2, 3, and 4 do not end in the same place at which they start, and therefore suggest the presence of an arc fault.

But, because the load can change somewhat during the course of an AC cycle, the endpoints of such a plot will not necessarily meet exactly even under actual load conditions. Detection of an arc fault will therefore in some embodiments consider the distance between the endpoints of the curve. For example, the endpoints of the curve of the plot shown in FIG. 3 are relatively far apart, and quite likely suggest an arc fault is present. The endpoints of the curve shown in FIG. 2 are somewhat closer, but still strongly suggest an arc fault is present. The curve in FIG. 4 has endpoints that are distinctly separate, but that are somewhat near one another and that suggest the presence of an arc fault less strongly than endpoint analysis of FIGS. 2 and 3.

Some example methods of arc fault detection will therefore employ other algorithms, or combinations of algorithms, to detect or confirm the presence of an arc fault. Looking again at the curve of FIG. 1, the normal curve is seen to be symmetric about the origin of the plot, or about the center of the oval formed by the current versus voltage plot.

Another characteristic of the current v. voltage curves shown in FIG. 1 that can be observed or measured to estimate the presence of an arc fault is symmetry of the curve about a central point. In the normal single-cycle curve shown at 101, the curve has symmetry about the origin, which is also the central point of the oval formed by the current v. voltage plot. More specifically, each point of the curve is very closely matched by a point the same distance away from the center point and opposite the center point. In the curves of FIGS. 2, 3, and 4, significant deviations from symmetry around a center point can be seen, both in distance and direction of the curve relative to the center point as the curve traces out a full cycle.

The center point or origin is encircled by the current v. voltage plot of FIG. 1, but is not encircled or enclosed by the arc-fault current v. voltage plots of FIG. 2 or 3, and is on the curve shown in FIG. 4. The position of the center point or origin within the curve can also be examined, and a significant shift from the zero voltage, zero current point (the origin) to the center of the current-voltage curve can be an indication of an arc fault. Further, if the origin is not encircled by the current v. voltage plot, as is the case for FIGS. 2, 3, and 4, the presence of an arc fault is suggested.

Examination of the curve of FIG. 1 also shows that a characteristic slope is present in the flattened oval—a line can be drawn tangent to the longest axis of the oval shape, which approximates the average slope of the curve as a whole. This slope is observable as an average slope of the curve, as well as a characteristic slope of he two flattened sides of the oval curve. Comparison to the curves of FIGS. 2, 3, and 4, show that the slope of the curves is not the same, either as an average or when the slope of long sections of relatively flat sections of the curve are examined. Presence of an arc fault is suggested in one specific embodiment of an arc fault detector by evaluating the slope of the curve at each sampling point, and evaluating the number of times the slope changes sign.

Examination of the curve of FIG. 1 also shows that the representative normal current v. voltage curve shown crosses the voltage and current axes that pass through the origin or zero current, zero voltage point, twice on each axis. The axis crossings also take place at points symmetrical about the origin, or at points equidistant from the other axis. The number of intercepts of an axis can be observed independently or in conjunction with symmetry of the axis intercepts, and used to estimate whether an arc fault is present. Looking at the curve of FIG. 2, the curve crosses the zero current axis once, and crosses the zero voltage axis once, suggesting an arc fault may be present. Evaluation of the symmetry of axis intercepts is not useful here, because neither axis is intercepted by the curve more than one time. Examination of the current v. voltage curve of FIG. 3 shows again a single zero current axis crossing, but multiple zero voltage axis crossings. This alone suggests that an arc fault may be present, but further examination of the lack of symmetry of the two zero-voltage axis intercepts shows that the intercepts are not the same distance from the origin, further suggesting presence of an arc fault.

Referring still to FIGS. 1-4, it can be seen that the slope of the phase plane plot of FIG. 1 varies in a regular and predictable manner, while the slope of the phase plane plots shown in FIGS. 2-4 show more dramatic changes in slope, as well as more variation in slope over the course of a power cycle. The presence of an arc fault can therefore also be detected or confirmed in various embodiments by monitoring the slope during the course of an AC power cycle, such as by calculating the slope at sampling points and comparing the slope between successive sampling points along the phase plane plot curve. Similarly, the normal phase plane plot of FIG. 1 shows a smooth and continuous rotation about the origin, while the plots of FIGS. 2-4 show reversal of direction, and lack of complete or smooth rotation about the origin.

In addition to evaluating the shape of a characteristic current-voltage curve, such as the single-cycle current-voltage curves shown in FIGS. 1-4, other signal characteristics can be easily measured and characterized to estimate the presence of an arc fault. The typical power signal of FIG. 1, for example, contains relatively little spectral content other than at the AC power frequency. Typical AC power signals are delivered at 60 Hz for residential or commercial power, and are provided at other frequencies for some applications such as 400 Hz for high-performance computer systems and airplane power systems. This fundamental power frequency is typically the dominant frequency observable in the power signal during normal operation, but can be accompanied by significant broadband noise in the presence of an arc fault. Examination of the spectral or frequency components of a signal over various periods of time can therefore also be used to identify or suggest the presence of an arc fault in a line.

Although these and other methods can be used to suggest the presence of an arc fault in a network, a combination of methods will provide greater certainty that an arc fault is present, and will help weed out temporary glitches in power signals that occur from normal events such as current inrush into a starting motor or a charging capacitor when a switch is thrown. In one example embodiment of the invention, some of these methods are applied in a detection portion of the arc-fault algorithm, and additional methods are applied in an arc fault verification portion of the algorithm. For example, a detection algorithm consists of examining a phase plane plot of the current v. voltage relationship of a power signal within a particular alternating current power cycle. If the detection algorithm determines an arc fault may be present, the current v. voltage phase plane plot over a period of multiple cycles is analyzed to determine whether an arc fault is actually present.

Evaluation of the phase plane plot is performed in some embodiments by sampling the current and voltage at regular intervals, such as from 40 to 100 samples per alternating current cycle. The samples are stored in a memory, and are used as data points for the various arc fault detection and confirmation algorithms. These data points are also used in further embodiments to derive area, perimeter, maximum current, maximum voltage, and other parameters of an alternating current cycle to detect or confirm the presence of an arc fault.

In some further embodiments, the detection algorithm is able to estimate whether an arc fault is a series or parallel arc fault, and uses the detected arc fault type information in employing the arc fault confirmation algorithm. For example, a parallel arc fault confirmation process may require that confirmation be completed in a relatively short period, such as 100 milliseconds, while a series arc fault detection may be confirmed using an arc fault confirmation algorithm over a longer period such as a period of two seconds. In still other embodiments, a detection algorithm employs one or more methods to detect the presence of an arc fault over a period of at least several clock samples, and further employs an arc fault confirmation algorithm comprising one or more methods to confirm the presence of an arc fault over subsequent samples. For example, in one embodiment each cycle is monitored independently for detection of an arc fault, and when an arc fault is detected a confirmation algorithm is applied to multiple subsequent cycles to confirm the presence of an arc fault before action is taken.

Figure 5:
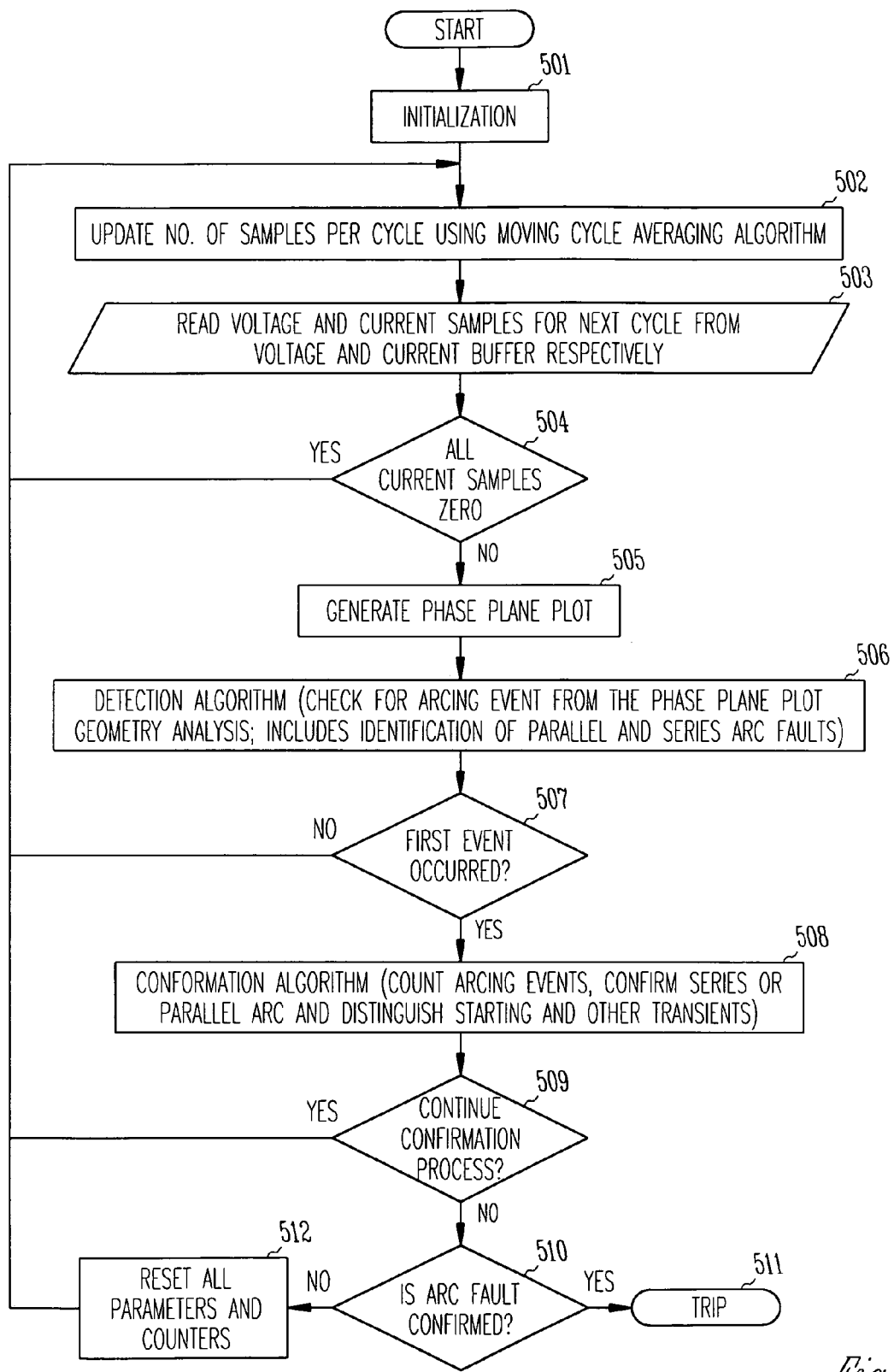
FIG. 5 is a flowchart showing a method of detecting an arc fault, consistent with an example embodiment of the present invention.
Figure 6:
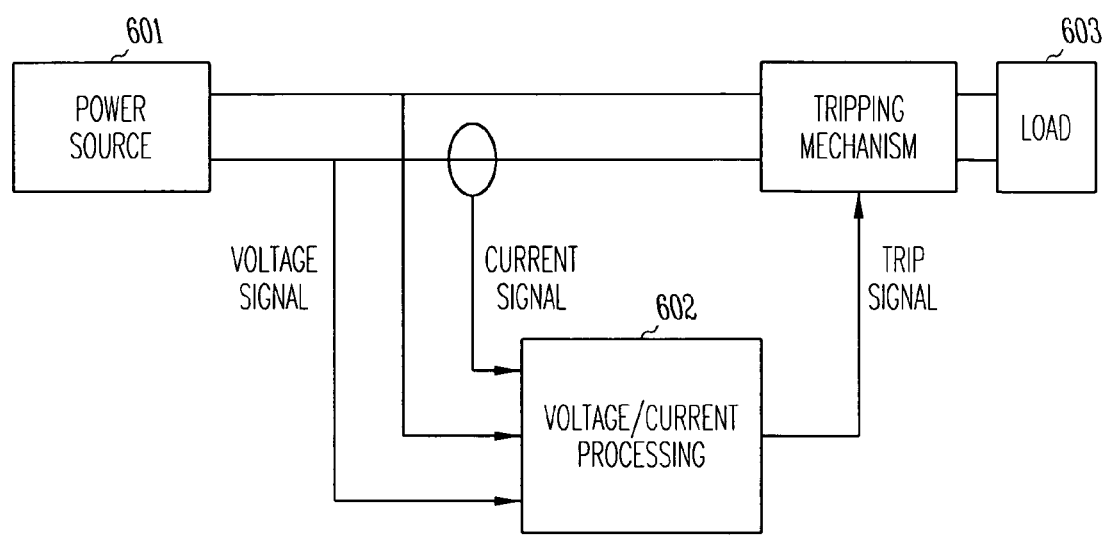
FIG. 6 is a block diagram of an arc fault detector in a power distribution network, consistent with an example embodiment of the present invention.

Upon detection and verification of an arc fault, the power signal or other electrical network signal being monitored will be cut off or tripped in some examples via a circuit interruption circuit or relay. An example of such a method is shown in greater detail in the flowchart of FIG. 5. The arc fault detection system is initialized at 501, and parameters such as the number of samples per cycle of the power signal being monitored are updated or configured at 502. Current and voltage data for a cycle of the power signal being monitored are recorded at 503, such as by retrieving the data from a buffer that stores monitored data. At 504, if all current samples are zero or are approximately zero, it can be reasonably assumed that there is no load and that no arc faults are present, so the method returns to 502 to update parameters for the next power cycles.

In one example, if all current samples are zero and the method repeatedly loops back to 502 from 504, the number of samples needed per cycle may be significantly fewer than will be recorded if some evidence of an arc fault is detected or if a varying load is present. If the current samples are not all approximately zero at 504, the phase plane plot similar to those of FIGS. 1-4 is produced at 505. A detection algorithm is then applied to the phase plane plot at 506, such as by employing at least one of the phase plane plot analysis methods described in conjunction with the discussion of FIGS. 1-4. If no arc fault is detected at 507, the method returns to 502 and repeats. If evidence of an arc fault is found, the method proceeds to 508, and a confirmation algorithm further analyzes the phase plane plot data to determine whether the current v. voltage phase plane plot indicates an arc fault is present. In some embodiments, the confirmation algorithm comprises further application of the phase plane plot evaluation methods discussed previously in conjunction with FIGS. 1-4, such as evaluation of arc fault characteristics in phase plane plots over a number of successive cycles of ac power. If arc fault confirmation requires more data, the method proceeds from 509 to 502, and in some embodiments increases the number of samples taken in the next cycle at 502. If further data is not needed and the arc fault is confirmed at 510, the circuit is tripped at 511, or is cut off from being fed power or an electrical signal to protect the equipment and the environment from the arc fault. If the data is determined not to indicate an arc fault at 510, the parameters and counters tracking the arc fault detection data are reset at 512, and the method returns to 502 to continue monitoring additional data for arc faults.

These examples of arc fault detection methods and systems presented here serve to illustrate how an electrical signal such as the power supply 601 of FIG. 1 can be isolated from a load 603 via an arc fault detector 602. Although specific examples of detection algorithms, confirmation algorithms, systems, and other embodiments of the invention are described herein, it will be appreciated by those of ordinary skill in the art that any arrangement which is calculated to achieve the same purpose may be substituted for the specific embodiments shown. This application is intended to cover any adaptations or variations of the invention. It is intended that this invention be limited only by the claims, and the full scope of equivalents thereof.

The invention claimed is:

1. A method of detecting an arc fault in an electrical circuit, comprising:
　　recording phase plane plot data of current versus voltage for at least one electrical cycle of an alternating current signal; and
　　applying a phase plane plot arc fault monitoring algorithm to the phase plane plot data to determine whether an arc fault is present, the phase plane plot arc fault monitoring algorithm comprising one or more sub-algorithms comprising one or more phase plane plot arc fault detection methods.

2. The method of detecting an arc fault in an electrical circuit of claim 1, wherein the phase plane plot arc fault detection methods comprise characterization of a distance between endpoints of an alternating current cycle in the phase plane plot data.

3. The method of detecting an arc fault in an electrical circuit of claim 1, wherein the phase plane plot arc fault detection methods comprise characterization of symmetry about the origin of the phase plane plot.

4. The method of detecting an arc fault in an electrical circuit of claim 1, wherein the phase plane plot arc fault detection methods comprise characterizing an angle difference in slope between successive values of the phase plane plot data.

5. The method of detecting an arc fault in an electrical circuit of claim 1, wherein the phase plane plot arc fault detection methods comprise detection of 360-degree rotation about the origin of the phase plane plot during an alternating current cycle.

6. The method of detecting an arc fault in an electrical circuit of claim 1, wherein the phase plane plot arc fault detection methods comprise detection of a number of intercepts of at least one of a voltage or a current axis of the phase plane plot during an alternating current cycle.

7. The method of detecting an arc fault in an electrical circuit of claim 1, wherein the phase plane plot arc fault detection methods comprise detecting a number of times slope of the phase plane plot changes between positive and negative during an alternating current cycle.

8. The method of detecting an arc fault in an electrical circuit of claim 1, wherein the sub-algorithms comprise an arc fault detection algorithm and an arc fault confirmation algorithm.

9. The method of detecting an arc fault in an electrical circuit of claim 8, wherein the arc fault detection algorithm is performed over one or more cycles, and the arc fault confirmation algorithm is performed over one or more subsequent cycles.

10. An arc fault detector comprising:
　　a voltage monitoring module;
　　a current monitoring module; and
　　an arc fault monitoring module operable to record phase plane plot data of current versus voltage for at least one electrical cycle of an alternating current power signal, and to apply a phase plane plot arc fault monitoring algorithm to the phase plane plot data to determine whether an arc fault is present, the phase plane plot arc fault monitoring algorithm comprising one or more sub-algorithms comprising one or more phase plane plot arc fault detection methods.

11. The arc fault detector of claim 10, wherein the phase plane plot arc fault detection methods comprise characterization of a distance between endpoints of an alternating current cycle in the phase plane plot data.

12. The arc fault detector of claim 10, wherein the phase plane plot arc fault detection methods comprise characterization of symmetry about the origin of the phase plane plot.

13. The arc fault detector of claim 10, wherein the phase plane plot arc fault detection methods comprise characterizing an angle difference in slope between successive values of the phase plane plot data.

14. The arc fault detector of claim 10, wherein the phase plane plot arc fault detection methods comprise detection of 360-degree rotation about the origin of the phase plane plot during an alternating current cycle.

15. The arc fault detector of claim 10, wherein the phase plane plot arc fault detection methods comprise detection of a number of intercepts of at least one of a voltage or a current axis of the phase plane plot during an alternating current cycle.

16. The arc fault detector of claim 10, wherein the phase plane plot arc fault detection methods comprise detecting a number of times slope of the phase plane plot changes between positive and negative during an alternating current cycle.

17. The arc fault detector of claim 10, wherein the sub-algorithms comprise an arc fault detection algorithm and an arc fault confirmation algorithm.

18. The arc default detector of claim 17, wherein the arc fault detection algorithm is performed over one or more cycles, and the arc fault confirmation algorithm is performed over one or more subsequent cycles.

19. The arc default detector of claim 10, further comprising a broadband noise detection module, operable to detect broadband noise and to determine whether a detected broadband noise level suggests presence of an arc fault.

20. The arc default detector of claim 10, wherein at least one of the voltage and current monitoring circuits comprise analog-to-digital converters operable to convert a detected voltage or current level to a digital signal.

21. The arc default detector of claim 10, wherein the arc fault monitoring module comprises a processor and memory.

22. The arc default detector of claim 10, further comprising a tripping mechanism operable to remove the alternating current power signal from a load.

23. A machine-readable medium with instructions stored thereon, the instructions when executed operable to cause a computerized arc detector to:

record phase plane plot data of current versus voltage for at least one electrical cycle of an alternating current signal; and apply a phase plane plot arc fault monitoring algorithm to the phase plane plot data to determine whether an arc fault is present, the phase plane plot arc fault monitoring algorithm comprising one or more sub-algorithms comprising one or more phase plane plot arc fault detection methods.

24. The machine-readable medium of claim 23, the instructions when executed further operable to cause the arc fault detector to monitor the alternating current signal for spectral content.

25. The machine-readable medium of claim 23, the instructions when executed further operable to plot the phase plane plot data in a visible form.

26. The machine-readable medium of claim 23, wherein the phase plane plot arc fault detection methods comprise characterization of a distance between endpoints of an alternating current cycle in the phase plane plot data.

27. The machine-readable medium of claim 23, wherein the phase plane plot arc fault detection methods comprise characterization of symmetry about the origin of the phase plane plot.

28. The machine-readable medium of claim 23, wherein the phase plane plot arc fault detection methods comprise characterizing an angle difference in slope between successive values of the phase plane plot.

29. The machine-readable medium of claim 23, wherein the phase plane plot arc fault detection methods comprise detection of 360-degree rotation about the origin of the phase plane plot during an alternating current cycle.

30. The machine-readable medium of claim 23, wherein the phase plane plot arc fault detection methods comprise detection of a number of intercepts of at least one of a voltage or a current axis of the phase plane plot during an alternating current cycle.

31. The machine-readable medium of claim 23, wherein the phase plane plot arc fault detection methods comprise detecting a number of times slope of the phase plane plot changes between positive and negative during an alternating current cycle.

32. The machine-readable medium of claim 23, wherein the sub-algorithms comprise an arc fault detection algorithm and an arc fault confirmation algorithm.

33. The machine-readable medium of claim 32, wherein the arc fault detection algorithm is performed over one or more cycles, and the arc fault confirmation algorithm is performed over one or more subsequent cycles.

* * * * *